(12) United States Patent
Ma et al.

(10) Patent No.: US 8,969,968 B2
(45) Date of Patent: Mar. 3, 2015

(54) ESD PROTECTION STRUCTURE AND SEMICONDUCTOR DEVICE COMPRISING THE SAME

(71) Applicant: Chengdu Monolithic Power Systems, Co., Ltd., Chengdu (CN)

(72) Inventors: Rongyao Ma, Chengdu (CN); Tieshing Li, San Jose, CA (US)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 14/141,337

(22) Filed: Dec. 26, 2013

(65) Prior Publication Data
US 2014/0183639 A1    Jul. 3, 2014

(30) Foreign Application Priority Data
Dec. 27, 2012    (CN) .......................... 2012 1 0578531

(51) Int. Cl.
*H01L 23/52* (2006.01)
*H01L 27/02* (2006.01)
*H01L 23/60* (2006.01)

(52) U.S. Cl.
CPC ............ *H01L 27/0292* (2013.01); *H01L 23/60* (2013.01); *H01L 2924/0002* (2013.01)
USPC ........................................................ 257/356

(58) Field of Classification Search
CPC ............................ H01L 27/0292; H01L 23/60
USPC ........................................................ 257/356
See application file for complete search history.

(56) References Cited

U.S. PATENT DOCUMENTS

| | | | |
|---|---|---|---|
| 8,575,707 B2* | 11/2013 | Tamaki et al. | 257/401 |
| 8,796,787 B2* | 8/2014 | Tamaki et al. | 257/401 |
| 2002/0045295 A1* | 4/2002 | Hiraga | 438/140 |
| 2002/0167071 A1* | 11/2002 | Wang | 257/620 |
| 2003/0170943 A1* | 9/2003 | Shibib | 438/197 |
| 2008/0277669 A1* | 11/2008 | Okuno et al. | 257/77 |
| 2012/0248499 A1* | 10/2012 | Kusunoki | 257/140 |

* cited by examiner

*Primary Examiner* — William D Coleman
(74) *Attorney, Agent, or Firm* — Perkins Coie LLP

(57) ABSTRACT

An ESD protection structure and a semiconductor device having an ESD protection structure with the ESD protection structure including a patterned conductive ESD protection layer. The ESD protection layer is patterned to have a first portion of a substantially closed ring shape having an outer contour line and an inner contour line parallel with each other. The outer and the inner contour lines are waved lines. The first portion further has a midline between and parallel with the outer and the inner contour lines. The midline is a waved line having a substantially constant curvature at each point of the midline. Therefore the ESD protection layer has a substantially uniform curvature and an increased perimeter which advantageously improve the breakdown voltage and the current handling capacity of the ESD protection structure.

13 Claims, 7 Drawing Sheets

ESD PROTECTION STRUCTURE AND SEMICONDUCTOR DEVICE COMPRISING THE SAME

CROSS-REFERENCE TO RELATED APPLICATION(S)

This application claims the benefit of CN application No. 201210578531.X filed on Dec. 27, 2012 and incorporated herein by reference.

TECHNICAL FIELD

This disclosure relates generally to semiconductor devices, and more particularly but not exclusively relates to semiconductor devices and ESD protection structures.

BACKGROUND

In most practical applications, it is necessary to provide protection structures to a semiconductor device so as to prevent the device from being damaged by a high voltage and/or a high current induced by electro-static discharge ("ESD"). Generally, for a semiconductor device, such as a metal oxide semiconductor field effect transistor ("MOSFET"), a junction field effect transistor ("JFET"), a double diffused metal-oxide semiconductor transistor ("DMOS") etc., an ESD protection module is coupled between a gate and a source of the semiconductor device to protect a gate oxide of such a device from being damaged by ESD. The ESD protection module is configured to provide a conduction path between the source and the gate of the device once a gate to source voltage of the device caused by ESD exceeds an ESD threshold voltage, so that a large extra energy due to ESD can be discharged promptly through the conduction path. The ESD protection module is usually desired to be integrated into the semiconductor device that it is intended to protect for reducing the size and manufacturing cost of the semiconductor device.

FIG. 1 illustrates a top plan view of an ESD protection structure 50. The ESD protection structure 50 may usually be formed by doping a polysilicon layer 51 with P type and N type dopants so as to form a plurality of alternately arranged P type doped regions 511 and N type doped regions 512 in the polysilicon layer 51. The ESD protection structure 50 therefore comprises a group of PN diodes, since every two adjacent P type doped region 511 and N type doped region 512 form a PN junction. In practical application, to name an example, the ESD protection structure 50 (i.e. the group of PN diodes) can be coupled between a source metal/electrode and a gate metal/electrode of a semiconductor transistor (e.g. MOSFET, JFET, DMOS etc.) to protect a gate oxide of a gate region of the transistor from being damaged by a large extra energy due to ESD.

The shape of the ESD protection structure 50 (including the ESD polysilicon layer 51 and the P type doped region 511 and N type doped region 512) generally can have a large influence to the protection performance of the ESD protection structure 50. Still referring to FIG. 1, the ESD protection structure 50 is typically formed in round rectangle shape. However, since each corner 501 of the round rectangle shape has a larger curvature than each side 502 of the round rectangle shape, when the ESD protection structure 50 is coupled to suffer a high voltage and/or a high current induced by ESD in practical application, electric field distribution in the ESD protection structure 50 is non-uniform. The electric field is more intensive in portions having relatively larger curvature (e.g. at each corner 501) than in portions having relatively smaller curvature (e.g. at each side 502) in the ESD protection structure 50. Therefore, the portions having relatively larger curvature are more vulnerable and easier to breakdown, which limits the high-voltage withstanding capacity of the ESD protection structure 50.

Another considerable factor that determines the protection performance of the ESD protection structure 50 is the area of PN junction formed by each group of adjacent P type doped region 511 and N type doped region 512. Providing the thickness of the ESD protection structure 50 (i.e. the thickness of the polysilicon layer 51 or the thickness of the plurality of P type doped regions 511 and N type doped regions 512) is defined, the PN junction area of each group of adjacent P type doped region 511 and N type doped region 512 is determined by the perimeter of the contacting contour of each group of adjacent P type doped region 511 and N type doped region 512. For instance, in FIG. 1, the perimeter of the round rectangle shaped contour of the ESD protection structure 50 determines the PN junction area of each group of adjacent P type doped region 511 and N type doped region 512. Increasing the perimeter of the contour shape of ESD protection structure 50 can increase the PN junction area of each group of adjacent P type doped region 511 and N type doped region 512, which advantageously helps to reduce the resistance of each PN diode. In consequence, the reduction in resistance of each PN diode enhances the current conduction capacity and current distribution uniformity of the ESD protection structure 50, and thus the ESD protection structure 50 can provide better ESD protection to the semiconductor device 10.

SUMMARY

In accomplishing the above and other objects, there has been provided, in accordance with an embodiment of the present invention, an ESD protection structure. The ESD protection structure has a patterned conductive ESD protection layer including a first portion of a substantially closed ring shape, wherein the ring shaped first portion has an outer contour line and an inner contour line parallel with each other, and wherein the outer contour line and the inner contour line are waved lines. The first portion further has a midline located between the outer contour line and the inner contour line, wherein the midline is a waved line and is substantially parallel with both the outer contour line and the inner contour line, and wherein the midline has a first distance to the outer contour line and a second distance to the inner contour line, and wherein the first distance and the second distance are substantially equal, and wherein the midline has a substantially constant curvature at each point of the midline. In an embodiment, the first portion is doped to include a plurality of first-conductivity-type doped zones and second-conductivity-type doped zones arranged alternately between the outer contour line and the inner contour line in a direction along a normal line of the midline at each point of the midline, wherein the first-conductivity-type is opposite to the second-conductivity-type, and wherein the contour lines of each of the first-conductivity-type doped zones and second-conductivity-type doped zones are substantially parallel with the outer contour line and the inner contour line of the first portion.

There has been further provided, in accordance with an embodiment of the present invention, a semiconductor device. The semiconductor device comprises: a semiconductor substrate of a first conductivity type; a semiconductor transistor, formed in the semiconductor substrate and having a drain region, a gate region, and a source region; and an ESD protection structure, formed atop a top surface of the semiconductor substrate, wherein the ESD protection structure comprises an ESD isolation layer and a patterned conductive ESD protection layer, and wherein the ESD isolation layer is disposed between the ESD protection layer and the substrate to isolate the ESD protection layer from the substrate. In an embodiment, the ESD protection layer comprises a first portion of a substantially closed ring shape, wherein the ring shaped first portion has an outer contour line and an inner contour line parallel with each other, and wherein the outer contour line and the inner contour line are waved lines. The first portion further has a midline located between the outer contour line and the inner contour line, wherein the midline is a waved line and is substantially parallel with both the outer contour line and the inner contour line, and wherein the midline has a first distance to the outer contour line and a second distance to the inner contour line, and wherein the first distance and the second distance are substantially equal, and wherein the midline has a substantially constant curvature at each point of the midline. In an embodiment, the first portion is doped to include a plurality of first-conductivity-type doped zones and second-conductivity-type doped zones arranged alternately between the outer contour line and the inner contour line in a direction along a normal line of the midline at each point of the midline, wherein the first-conductivity-type is opposite to the second-conductivity-type, and wherein the contour lines of each of the first-conductivity-type doped zones and second-conductivity-type doped zones are substantially parallel with the outer contour line and the inner contour line of the first portion.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," "right," "in," "out," "front," "back," "up," "down," "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. The symbols "+" and "−" when used to describe dopants or doped regions/zones are merely used to descriptively indicate relative dopant concentration levels, but not intend to specify or limit the dopant concentration ranges, nor intend to add other limitations to the dopants and doped regions/zones. For instance, both "$N^+$ type" and "$N^-$ type" can be referred to as "N type" in more general terms, and both "$P^+$ type" and "$P^-$ type" can be referred to as "P type" in more general terms. Those skilled in the art should understand that the meanings of the terms identified above do not necessarily limit the terms, but merely provide illustrative examples for the terms.

Figure 1:
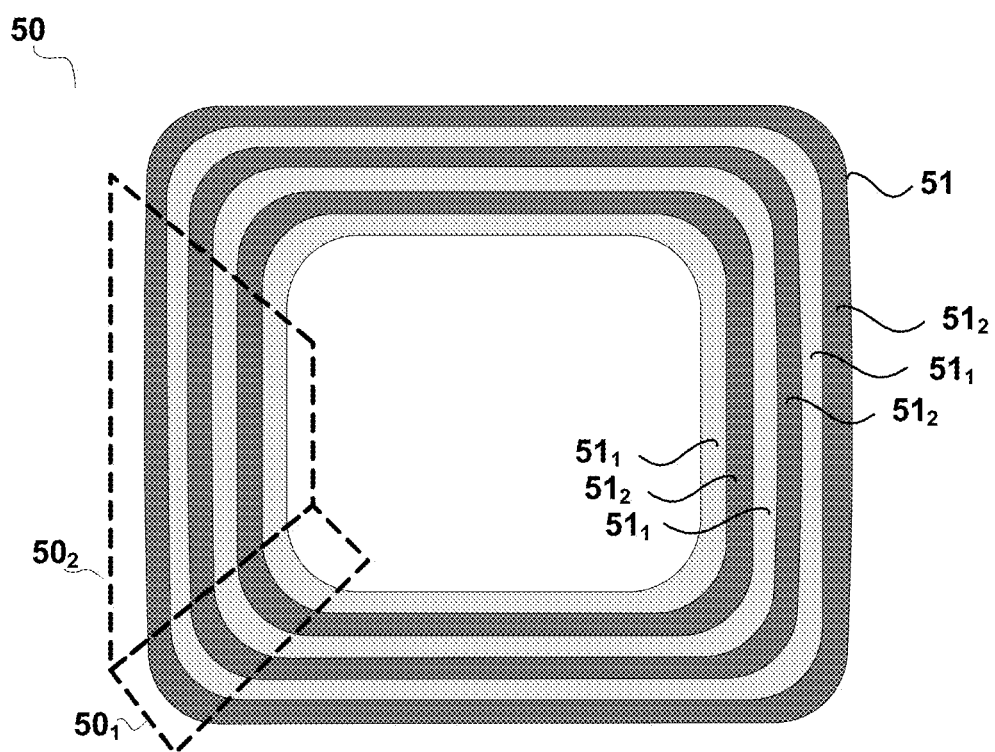
FIG. 1 illustrates a top plan view of an existing ESD protection structure 50.
Figure 2:
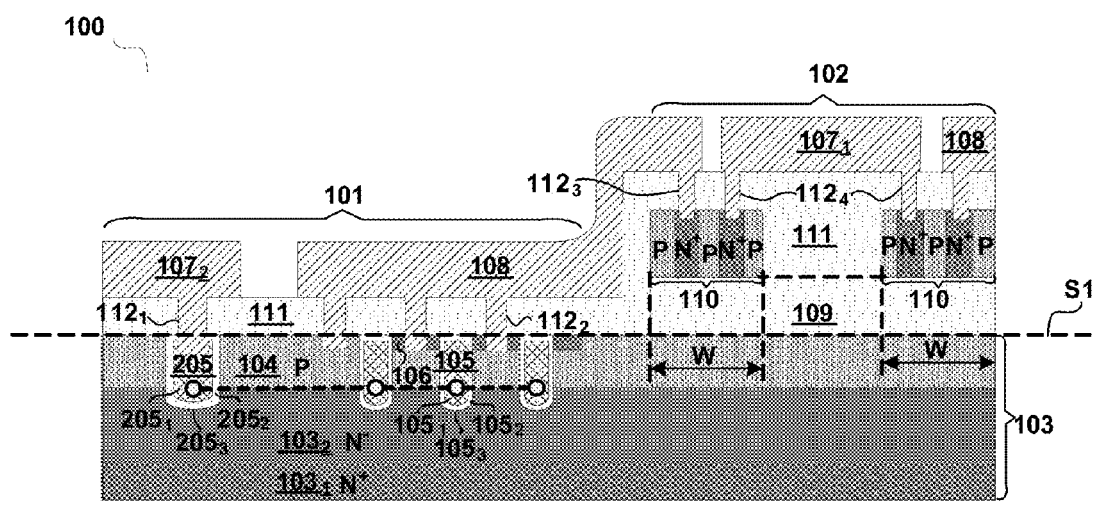
FIG. 2 illustrates a cross-sectional view of a semiconductor device 100 in accordance with an exemplary embodiment of the present invention.
Figure 3:
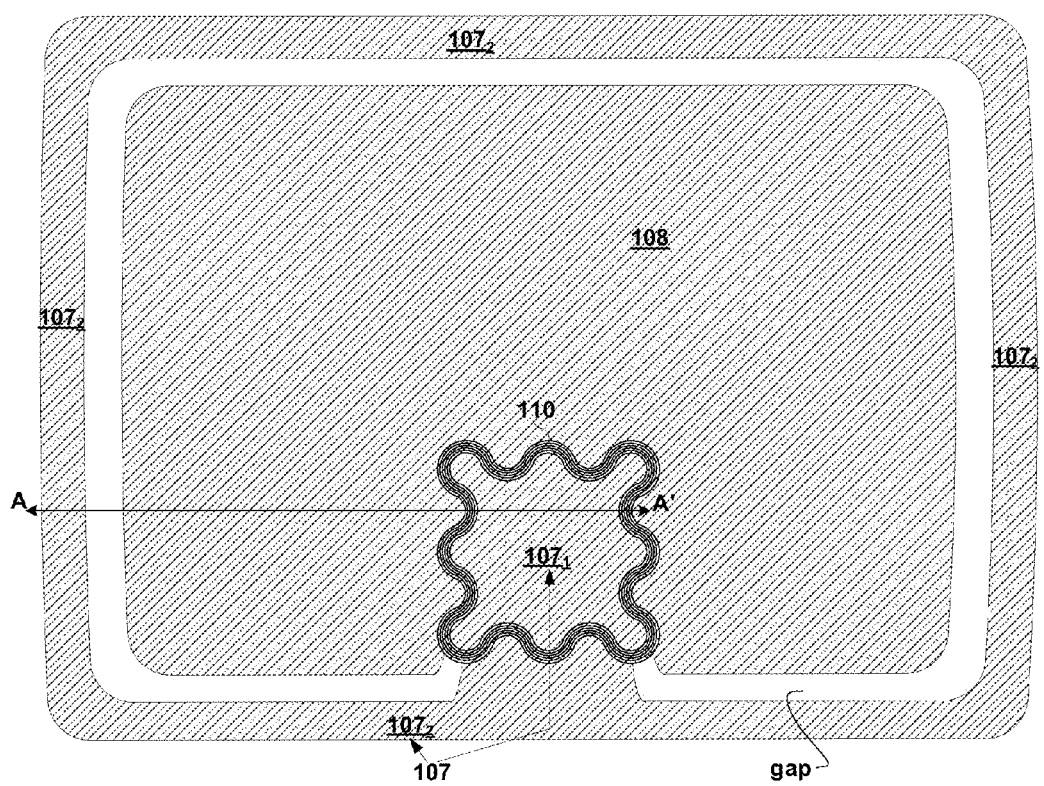
FIG. 3 illustrates a top plan view of the semiconductor device 100 in accordance with an exemplary embodiment of the present invention.

FIG. 2 illustrates a cross-sectional view of a semiconductor device 100 in accordance with an exemplary embodiment of the present invention. FIG. 3 illustrates a top plan view of the semiconductor device 100 in accordance with an exemplary embodiment of the present invention. In accordance with an embodiment of the present invention, the semiconductor device 100 may comprise a semiconductor transistor 101 (e.g. illustrated in FIG. 2 as a MOSFET at the left side of the device 100) and an electro-static discharge ("ESD") protection structure 102 (e.g. illustrated in FIG. 2 at the right side of the device 100). It should be noted that FIG. 3 illustrates a top plan view of the whole die of semiconductor device 100 with only the metal layer and the polysilicon layer of the ESD protection structure 102 shown, while FIG. 2 illustrates a cross-sectional view of only portions of the semiconductor device 100. For example, it can be understood that the cross-sectional view of FIG. 2 corresponds to the portion cut from the cut line AA' in FIG. 3. However, it should also be understood that the corresponding relationship between the cross-sectional view and the top plan view of the semiconductor device 100 illustrated in FIG. 2 and FIG. 3 are not intended to be limiting.

In the exemplary embodiment shown in FIG. 2, the semiconductor device 100 has a substrate 103 of a first conductivity type (e.g. illustrated as N type in FIG. 2). The substrate 103 may comprise a relatively heavy doped substrate layer $103_1$ (e.g. illustrated as an $N^+$ substrate layer in FIG. 2) and a relatively light doped epitaxial layer $103_2$ (e.g. illustrated as an N⁻ epitaxial layer in FIG. 2) formed on the substrate layer $103_1$. That is to say, the substrate layer $103_1$ has a larger dopant concentration than the epitaxial layer $103_2$. However, this is not intended to be limiting, in other embodiments, the substrate 103 may comprise doped silicon (Si), Silicon-Germanium (SiGe), Silicon on insulator (SOI) and/or any other suitable semiconductor materials. It should be noted that in the embodiments illustrated in FIG. 2, the boundaries, indicated with the curly braces, between the semiconductor transistor 101 and the ESD protection structure 102 are illustrative and approximate rather than limiting and absolute.

In accordance with an embodiment of the present invention, the semiconductor transistor 101 may comprise a drain region (103), a gate region 105, and a source region 106. In the example of FIG. 2, the semiconductor transistor 101 is configured as a vertical transistor, wherein the heavy doped substrate layer $103_1$ functions as the drain region of the semiconductor transistor 101, and the light doped epitaxial layer $103_2$ functions as a drift region. The source region 106 is located laterally adjacent to both sides (left side/a first side and right side/a second side opposite to the first side) of the gate region 105, and may have the first conductivity type with a relatively heavy dopant concentration, e.g. heavier than the dopant concentration of the epitaxial layer $103_2$. For instance, in FIG. 2, the source region 106 is exemplarily illustrated as an N⁺ type doped region, and may have a dopant concentration higher than $1 \times 10^{19}$ cm⁻³, while the N⁻ type doped epitaxial layer $103_2$ may have a dopant concentration ranges from $1 \times 10^{14}$ cm⁻³ to $1 \times 10^{17}$ cm⁻³. However, one of ordinary skill in the art should understand that the dopant concentration ranges provided herein are just examples and are not intended to be limiting, any suitable dopant concentrations may be chosen according to practical design, fabrication and application requirements.

In accordance with an embodiment of the present invention, the semiconductor transistor 101 may further comprise a body region 104 formed in the substrate 103. The body region 104 may have a second conductivity type (e.g. illustrated as P type in FIG. 2) opposite to the first conductivity type and may be formed through second-conductivity-type dopant implantation in the substrate 103 (from the top surface of the epitaxial layer $103_2$). The body region 104 may have a relatively light dopant concentration compared to the source region 106.

In the exemplary embodiment shown in FIG. 2, the gate region 105 for the semiconductor transistor 101 is illustrated as a trenched gate region, comprising a trenched gate conduction layer $105_1$ and a gate dielectric layer $105_2$ formed in a gate trench $105_3$. The gate trench $105_3$ is formed in the substrate 103, extends vertically from the top surface S1 of the substrate 103 through the body region 104 into the epitaxial layer $103_2$. The gate dielectric layer $105_2$ lines the sidewalls and the bottom of the gate trench $105_3$, and the trenched gate conduction layer $105_1$ fills the lined gate trench $105_3$ and is thus isolated from the substrate 103 and the body region 104 by the gate dielectric layer $105_2$. In the example of FIG. 2, a plurality of trenched gate regions 105 are shown, the plurality of trenched gate regions 105 illustrated in sectional view are actually electrically connected with each other by transverse segments (illustrated in FIG. 2 by dotted line) of the trenched gate regions 105 having the same structure as those shown in the sectional view.

In accordance with an embodiment of the present invention, still referring to FIG. 2 and FIG. 3, the semiconductor device 100 may further comprise a source electrode 108 electrically coupled to the source region 106, a gate electrode 107 electrically coupled to the gate region 105 and a drain electrode (not shown in FIG. 2) electrically coupled to the drain region $103_1$. In the embodiment shown in FIG. 2, the source electrode 108 is exemplarily illustrated as to comprise a source metal 108, the gate electrode 107 is exemplarily illustrated as to comprise a gate metal 107 formed around outside of the source metal 108 and surrounding the source metal 108, with a gap therebetween to separate the gate metal 107 from the source metal 108. The gate metal 107 may comprise a gate metal pad $107_1$ and a gate metal runner $107_2$. In other embodiments, the gate metal 107 may not necessarily totally surrounds the source metal 108. In FIG. 3, the source metal 108 is exemplarily illustrated to have a relatively large area compared to the gate metal 107 so as to enhance the capability of handling drain to source current of the source electrode 108 and to improve heat dissipation when the semiconductor device 100 is in conduction.

According to an embodiment of the present invention, the trenched gate regions 105 are electrically coupled to the gate metal 107 via at least one trenched gate contact 205. Similarly as the trenched gate regions 105, each trenched gate contact 205 may comprise a contact conduction layer $205_1$ and a contact dielectric layer $205_2$ formed in a contact trench $205_3$. Each trenched gate contact 205 has a trench width greater than that of the trenched gate regions 105 to facilitate the connection, e.g. through interlayer vias (illustrated in FIG. 2 as interlayer vias $112_1$), between the contact conduction layer $205_1$ and the gate metal 107 so as to couple the gate regions 105 to the gate metal 107. In one embodiment, the gate trenches $105_3$ and the contact trench $205_3$ are connected by a transverse segment (illustrated in FIG. 2 by dotted line) of either the gate trenches $105_3$ or the contact trench $205_3$ such that the trenched gate conduction layer $105_1$ is connected to the contact conduction layer $205_1$. Similarly as for the trenched gate regions 105, the contact dielectric layer $205_2$ lines the sidewalls and the bottom of the contact trench $205_3$, and the contact conduction layer $205_1$ fills the lined trench $205_3$ and is thus isolated from the substrate 103 and the body region 104 by the contact dielectric layer $205_2$. In one embodiment, the contact conduction layer $205_1$ and the trenched gate conduction layer $105_1$ may comprise a same conduction material such as doped polysilicon. In other embodiments, the contact conduction layer $205_1$ and the trenched gate conduction layer $105_1$ may comprise different conduction materials. In one embodiment, the contact dielectric layer $205_2$ and the gate dielectric layer $105_2$ may comprise a same dielectric material such as silicon dioxide. In other embodiments, the contact dielectric layer $205_2$ and the gate dielectric layer $105_2$ may comprise different dielectric materials. In FIG. 2, the contact trench $205_3$ and the gate trenches $105_3$ are illustrated to have a depth substantially the same, while in other embodiment the depth of the contact trench $205_3$ may not match that of the gate trenches $105_3$. One having ordinary skill in the art should understand that the structures and connections of the gate regions 105 and the trenched gate contact 205 shown in FIG. 2 are only for purpose of illustration. Actually, the structures, arrangements, and connection relationships of the gate regions 105 and the trenched gate contact 205 are not limited to that shown in FIG. 2 and that described above with reference to FIG. 2.

In accordance with an embodiment of the present invention, the ESD protection structure 102 is formed atop the top surface S1 of the substrate 103, and is electrically coupled between the gate metal 107 and the source metal 108, as illustrated in the cross-sectional view of FIG. 2, e.g. through the interlayer vias $112_3$ and $112_4$.

In an exemplary embodiment, the ESD protection structure 102 is disposed substantially under a portion of the gate metal pad $107_1$ and is laterally extended under an adjacent portion of the source metal 108, wherein the adjacent portion of the source metal 108 is substantially surrounding the gate metal pad $107_1$. For instance, in an embodiment, still referring to the cross-sectional illustration of FIG. 2, the ESD protection structure 102 has a portion under a portion of the gate metal pad $107_1$ to form a first overlapped area between the ESD protection structure 102 and the gate metal pad $107_1$, and another portion laterally extended under a portion of the source metal 108 to form a second overlapped area between the ESD protection structure 102 and the source metal 108. In this circumstance, the ESD protection structure 102 can be electrically coupled to the overlying gate metal pad $107_1$ and the overlying source metal 108 respectively through a plurality of interlayer vias $112_3$ disposed in the first overlapped area and a plurality of interlayer vias $112_4$ disposed in the second overlapped area. When observed from a top plan paralleled with the top surface S1 of the substrate 103, the ESD protection structure 102 is substantially surrounding the gate metal pad $107_1$ and has a closed shape, as illustrated in the top plan view of the exemplary embodiment of FIG. 3.

In accordance with an embodiment of the present invention, the ESD protection structure 102 may comprise an ESD protection layer 110 and an ESD isolation layer 109 disposed between the ESD protection layer 110 and the substrate 103 to isolate the ESD protection layer 110 from the substrate 103. In accordance with an embodiment of the present invention, referring to FIG. 2, the ESD protection layer 110 and the ESD isolation layer 109 are consistent in outer contour line shape. The ESD protection layer 110 may comprise a patterned conductive layer (e.g. polysilicon layer), wherein the patterned conductive layer is doped to include a plurality of alternately disposed first-conductivity-type doped zones $110_1$ (e.g. illustrated in FIG. 2 as N⁺ type doped zones represented by charcoal grey filled blocks) and second-conductivity-type doped zones $110_2$ (e.g. illustrated in FIG. 2 as P type doped zones represented by light grey filled blocks), i.e. the plurality of first-conductivity-type doped zones $110_1$ and the plurality of second-conductivity-type doped zones $110_2$ are interleaved with each other. For instance, in the examples shown in FIG. 2 and FIG. 3, the plurality of alternately disposed first-conductivity-type doped zones $110_1$ and second-conductivity-type doped zones $110_2$ are illustrated as a plurality of alternately disposed N⁺ type and P type doped zones having an arrangement P—N⁺—P—N⁺—P from an inner side to an outer side of the ESD protection layer 110, wherein the inner side in these particular examples may refer to the side adjacent to the gate metal pad $107_1$ and the outer side may refer to the side adjacent to the source metal 108. Therefore, according to the exemplary embodiments described with reference to FIGS. 2-3, the ESD protection structure 102 actually includes a plurality of PN diodes (PN junctions) that are formed by the plurality of alternately disposed first-conductivity-type doped zones $110_1$ and second-conductivity-type doped zones $110_2$ in the ESD protection layer 110, with every group of adjacent first-conductivity-type doped zone $110_1$ and second-conductivity-type doped zone $110_2$ forming a PN diode/PN junction. In other alternative embodiments of the present invention, the ESD protection layer 110 may be formed of other conductive or semi-conductive materials other than polysilicon that are compatible with other aspects of the device manufacturing process. Thus, the term "polysilicon" is intended to include such other conductive or semi-conductive materials and combinations thereof in addition to silicon.

In the present disclosure, the terms "lateral" and "laterally" refer to a direction parallel to the cut line AA'. The term "width" and the like refer to a size measured laterally. The terms "vertical" and "vertically" refers to a direction perpendicular to the top surface S1 of the substrate 103. The terms "depth", "height", "thickness" and the like refer to a size measured vertically.

Figure 4:
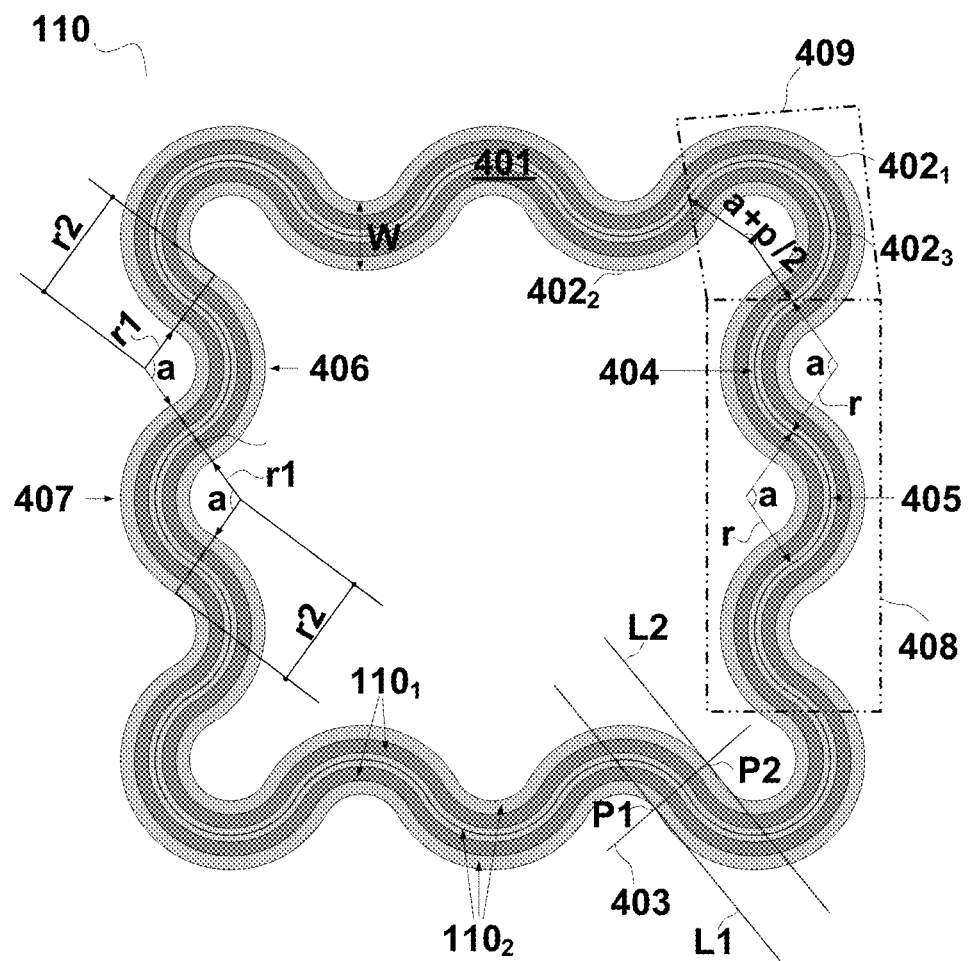
FIG. 4 illustrates an enlarged top plan view of the ESD protection layer 110 in the semiconductor device 100 in accordance with an exemplary embodiment of the present invention.

FIG. 4 illustrates an enlarged top plan view of the ESD protection layer 110 of the ESD protection structure 102 in accordance with an exemplary embodiment of the present invention. For instance, the top plan view of FIG. 4 may be considered as observed from a plan parallel with the top surface S1 of the substrate 103. In the exemplary embodiment of FIG. 4, the ESD protection layer 110 (e.g. a doped polysilicon layer) is patterned to comprise a first portion 401 having a closed ring shape with waved contour lines (e.g. the entire filled portion in FIG. 4). For instance, the first portion 401 has an outer contour line $402_1$ and an inner contour line $402_2$, wherein the outer contour line $402_1$ envelopes and defines an outer side edge of the first portion 401, and the inner contour line $402_2$ envelopes and defines an inner side edge of the first portion 401. The outer contour line $402_1$ and the inner contour line $402_2$ are waved contour lines and are substantially paralleled with each other. Thus, the closed ring shaped first portion 401 defined by the outer contour line $402_1$ and the inner contour line $402_2$ has a ring width W substantially uniform and constant measured radially (i.e. measured in a radial direction) at each point of the closed ring shape. The first portion 401 further has a midline $402_3$ (illustrated by a dotted waved line in FIG. 4) located substantially at the middle of the first portion 401, between the outer contour line $402_1$ and the inner contour line $402_2$. The midline $402_3$ is also a waved line and is substantially parallel with both the outer contour line $402_1$ and the inner contour line $402_2$, wherein the midline $402_3$ has a first distance d1 to the outer contour line $402_1$ and a second distance d2 to the inner contour line $402_2$, and wherein the first distance d1 and the second distance d2 are substantially equal. It should be noted that both the first distance d1 and the second distance d2 are measured radially.

In accordance with an embodiment of the present invention, the midline $402_3$ has a substantially constant curvature, e.g. expressed by K, at each point of the midline $402_3$. In accordance with an embodiment of the present invention, the first portion 401 is doped to include the plurality of first-conductivity-type doped zones $110_1$ (e.g. illustrated in FIG. 4 as N⁺ type doped zones represented by charcoal grey filled ring belts having waved contour lines) and second-conductivity-type doped zones $110_2$ (e.g. illustrated in FIG. 4 as P type doped zones represented by light grey filled ring belts having waved contour lines), wherein the plurality of first-conductivity-type doped zones $110_1$ and second-conductivity-type doped zones $110_2$ are arranged alternately between the outer contour line $402_1$ and the inner contour line $402_2$ in a direction along a normal line of the midline $402_3$ at each point of the midline $402_3$. Each of the first-conductivity-type doped zones $110_1$ and the second-conductivity-type doped zones $110_2$ has a substantially uniform and constant ring width measured radially. That is to say, the contour lines of each of the first-conductivity-type doped zones $110_1$ and the second-conductivity-type doped zones $110_2$ are substantially parallel with the outer contour line $402_1$, the inner contour line $402_2$ and the midline $402_3$. It should be understood by one of ordinary skill in the art that the ring width W of the first portion 401, as well as the ring width of each of the first-conductivity-type doped zones $110_1$ and the second-conductivity-type doped zones $110_2$ may be designed according to practical requirement. The "normal line" in the present disclosure has the definition of a normal line in geometry. For example, a normal line of the outer contour line $402_1$ at any given point of the outer contour line $402_1$ is defined as a line perpendicular to the tangent line at that given point. Similarly, a normal line of the inner contour line $402_2$ at any given point of the inner contour line $402_2$ is defined as a line perpendicular to the tangent line at that given point. To provide an example, a normal line 403 among all the normal lines of the outer contour line $402_1$ and the inner contour line $402_2$ is illustrated in FIG. 4. The normal line 403 intersects with the outer contour line $402_1$ and the inner contour line $402_2$ respectively at a first point P1 and a second point P2. The normal line 403 is perpendicular to the tangent line L1 of the outer contour line $402_1$ at the first point P1, and is perpendicular to the tangent line L2 of the inner contour line $402_2$ at the second point P2.

According to the exemplary embodiments described with reference to FIGS. 2-4, since the midline $402_3$ of the first portion 401 has a substantially constant curvature K at any given point of that midline $402_3$, the first portion 401 in entirety has a substantially constant or uniform curvature. In consequence, each of the plurality of first-conductivity-type doped zones $110_1$ and second-conductivity-type doped zones $110_2$ formed in the first portion 401 has a substantially constant or uniform curvature either. Therefore, when the ESD protection structure 102 is connected to electrical potentials (i.e. the PN diodes formed by the plurality of first-conductivity-type doped zones $110_1$ and second-conductivity-type doped zones $110_2$ are connected to electrical potentials), for instance, when the ESD protection structure 102 is coupled to suffer a high voltage and/or a high current induced by ESD in practical application to protect the semiconductor device 100 from being damaged, electric field distribution in the ESD protection structure 102 is substantially uniform. In this circumstance, each PN diode/PN junction formed by each group of adjacent first-conductivity-type doped zone $110_1$ and second-conductivity-type doped zone $110_2$ is less likely to breakdown due to nonuniform electric field distribution, and thus the breakdown voltage (i.e. the high-voltage withstanding capacity) of the ESD protection structure 102 is improved/increased. In another aspect, since the outer contour line $402_1$ and the inner contour line $402_2$ are waved contour lines substantially parallel with each other, the contour lines of each of the plurality of first-conductivity-type doped zones $110_1$ and second-conductivity-type doped zones $110_2$ that are substantially parallel with the outer contour line $402_1$ and the inner contour line $402_2$ are waved contour lines as well. Therefore, the perimeter of the contour lines of each of the plurality of first-conductivity-type doped zones $110_1$ and second-conductivity-type doped zones $110_2$ is increased, leading to an increase in PN junction area of each of the PN diodes providing the thickness of the ESD protection structure 102 is defined, which advantageously reduces the resistance of each of the PN diodes and enhances the current conduction capacity and current distribution uniformity of the ESD protection structure 102.

In accordance with an embodiment of the present invention, still referring to FIG. 4, the midline $402_3$ of the first portion 401 of the ESD protection structure 102 comprises a plurality of alternately connected concave arcs 404 and convex arcs 405, wherein each concave arc 404 is arched to the inner side of the ring shaped first portion 401, and wherein each convex arc 405 is arched to the outer side of the ring shaped first portion 401. In accordance with an embodiment of the present invention, the concave arcs 404 and the convex arcs 405 have a substantially same radius, e.g. labeled as r in FIG. 4, so that each group of adjacent concave arc 404 and convex arc 405 can be smoothly connected to each other. In this fashion, the waved midline $402_3$ that makes a closed ring has a substantially constant curvature K at any given point of that midline $402_3$.

Still referring to the exemplary embodiment shown in FIG. 4, the outer contour line $402_1$ and the inner contour line $402_2$ of the first portion 401 also respectively comprise a plurality of alternately connected concave arcs and convex arcs, similarly as the midline $402_3$ which is parallel with them, so that the first portion 401 in entirety comprises a plurality of alternately connected concave arched portions 406 and convex arched portions 407 that make a closed ring shape. Each concave arched portion 406 is arched to the inner side of the ring shaped first portion 401, and each convex arched portion 407 is arched to the outer side of the ring shaped first portion 401. In accordance with an embodiment of the present invention, each of the concave arched portions 406 and the convex arched portions 407 has a substantially same inside radius (e.g. labeled as r1 in FIG. 4) and a substantially same outside radius (e.g. labeled as r2 in FIG. 4), so that each group of adjacent concave arched portion 406 and convex arched portion 407 can be smoothly connected to each other. In this fashion, the ring shaped first portion 401 can be considered as being made by a waved belt having a substantially uniform width W and consisting of the alternately connected concave arched portions 406 and convex arched portions 407 so that the ring shaped first portion 401 in entirety has a substantially constant or uniform curvature. Consequently, the breakdown voltage of the ESD protection structure 102 is improved. It should be understood by those having ordinary skill in the art that the inside radius r1 and the outside radius r2 of each concave arched portion 406 are defined in geometric point of view considering the concave arched portion 406 as an observation unit. As illustrated in FIG. 4, the inside radius r1 of a given concave arched portion 406 refers to the radius of the arc contour line (which is actually an arc segment on the outer contour line $402_1$ of the first portion 401) at the concave side of that concave arched portion 406, and the outside radius of that given concave arched portion 406 refers to the radius of the arc contour line (which is actually an arc segment on the inner contour line $402_2$ of the first portion 401) at the convex side of that concave arched portion 406. Similarly, the inside radius r1 and the outside radius r2 of each convex arched portion 407 are defined in geometric point of view considering the convex arched portion 407 as an observation unit. Still referring to the illustration in FIG. 4, the inside radius r1 of a given convex arched portion 407 refers to the radius of the arc contour line (which is actually an arc segment on the inner contour line $402_2$ of the first portion 401) at the concave side of that convex arched portion 407, and the outside radius of that given convex arched portion 407 refers to the radius of the arc contour line (which is actually an arc segment on the outer contour line $402_1$ of the first portion 401) at the convex side of that convex arched portion 407.

In accordance with an embodiment of the present invention, still referring to FIG. 4, the plurality of the first-conductivity-type doped zones $110_1$ and second-conductivity-type doped zones $110_2$ in the first portion 401 comprise a middle doped zone $110_2$ (e.g. illustrated in FIG. 4 by a light grey filled waved ring belt) of the second conductivity type and formed along the midline $402_3$ of the first portion 401, and a plurality of first-conductivity-type doped zones $110_1$ (e.g. illustrated in FIG. 4 by charcoal grey filled waved ring belts) and second-conductivity-type doped zones $110_2$ (e.g. illustrated in FIG. 4 by light grey filled waved ring belts) arranged alternately from both sides of the middle doped zone $110_2$ towards both the outer contour line $402_1$ and the inner contour line $402_2$ of the first portion 401. It should be understood that the arrangement of the plurality of the first-conductivity-type doped zones $110_1$ and second-conductivity-type doped zones $110_2$ illustrated in FIG. 4 is just illustrative and not intended to be limiting. In other embodiment, the plurality of the first-conductivity-type doped zones $110_1$ and second-conductivity-type doped zones $110_2$ can be arranged differently.

In accordance with an embodiment of the present invention, still referring to FIG. 4, the first portion 401 of the ESD protection structure 102 is substantially of a rectangle ring shape made by the plurality of alternately connected concave arched portions 406 and convex arched portions 407. At each side of the rectangle ring shape (among the four sides of the rectangle ring shape), for instance, the side indicated by dashed line rectangle 408 in FIG. 4, the concave arcs 404 and the convex arcs 405 of the midline $402_3$ have a substantially equal radian, illustrated in FIG. 4 as a. At each corner of the rectangle shape (among the four corners of the rectangle ring shape), for instance, the corner indicated by dashed line rectangle 409 in FIG. 4, the arcs, either concave arcs 404 or convex arcs 405 (in FIG. 4 illustrated exemplarily as a convex arc 405) of the midline $402_3$ have a radian of $\pi/2$ larger than the radian a of the arcs on each side of the rectangle ring shape, e.g. illustrated in FIG. 4 as $\alpha+\pi/2$.

It should be noted that, in the present disclosure, the expression "the first portion 401 of the ESD protection structure 102 is substantially of a rectangle ring shape" means that the first portion 401 in general and in entirety is substantially of a rectangle ring shape while the waves on the rectangle ring formed by the alternately connected concave arched portions 406 and convex arched portions 407 are neglected. In other words, the first portion 401 can be considered as being patterned by replacing straight sides of a normal rectangle with the above mentioned alternately connected concave arched portions 406 and convex arched portions 407. In the following descriptions, when it refers to the description of the shape of the first portion 401, it should be considered as the shape of the first portion 401 in general and in entirety with the waves (concave and convex portions) neglected.

Figure 5:
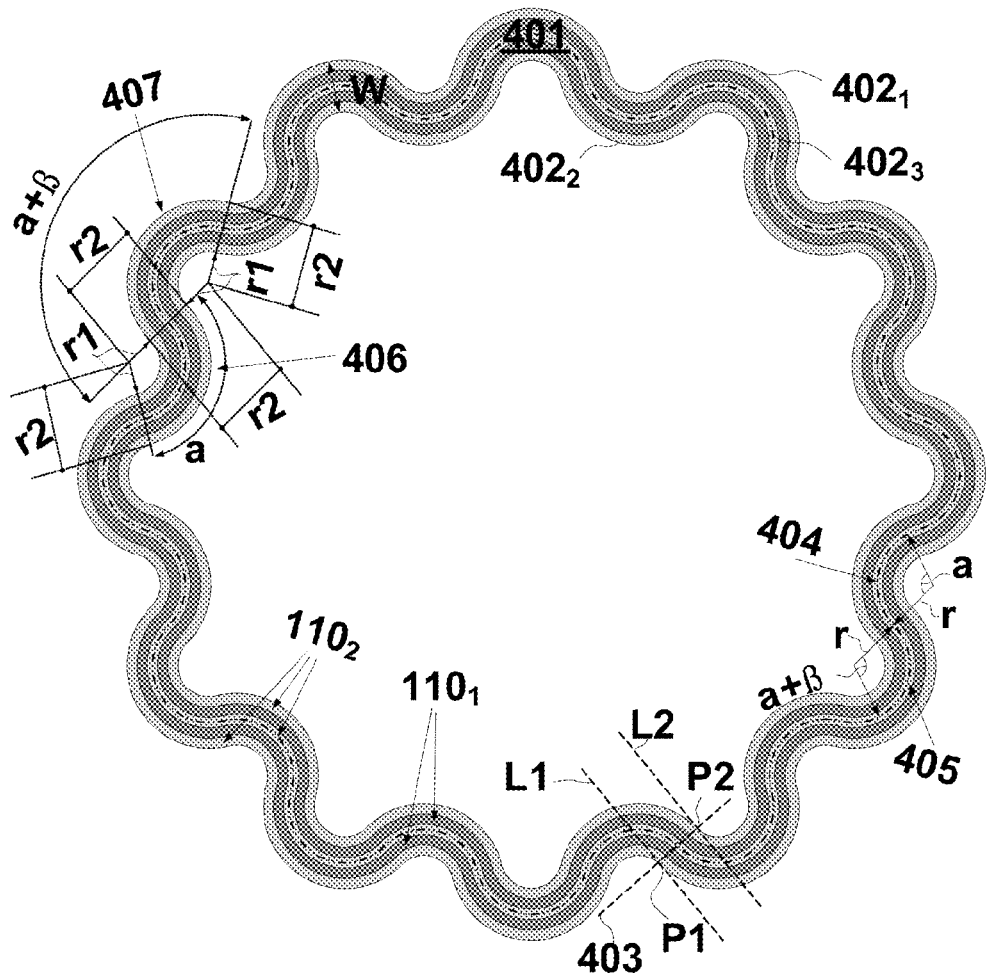
FIG. 5 illustrates an enlarged top plan view of the ESD protection layer 110 in the semiconductor device 100 in accordance with an alternative exemplary embodiment of the present invention.

FIG. 5 illustrates an enlarged top plan view of the ESD protection layer 110 of the ESD protection structure 102 in accordance with an alternative exemplary embodiment of the present invention. In accordance with the exemplary embodiment of FIG. 5, the first portion 401 of the ESD protection structure 102 is substantially of a circular ring shape with waved contour lines (e.g. the entire filled portion in FIG. 5). The circular ring shaped first portion 401 is still defined by the outer contour line $402_1$ and the inner contour line $402_2$. Most of the features in the embodiment of FIG. 5 are similar as those in the embodiment of FIG. 4 and are not addressed again herein for simplicity. The midline $402_3$ of the first portion 401 in FIG. 5 has a substantially constant curvature K at any given point of that midline $402_3$ and also comprises a plurality of alternately connected concave arcs 404 and convex arcs 405 that have substantially a same radius, e.g. labeled as r in FIG. 5. Each of the concave arcs 404 has a substantially equal radian, illustrated in FIG. 5 as a. Each of the convex arcs 405 has a substantially equal radian, illustrated in FIG. 5 as $(\alpha+\beta)$. That is to say, each of the concave arcs 404 has a designed radian difference $\beta$ from each of the convex arcs 405. For instance, in an exemplary embodiment, the radian a of each of the concave arcs 404 is set to be $2\pi/3$, and the radian $(\alpha+\beta)$ of each of the convex arcs 405 is set to be $(2\pi/3+\pi/6)$, i.e. the radian difference $\beta$ is set to be $\pi/6$.

Those having ordinary skill in the art should understand that in the exemplary embodiments of FIG. 4 and FIG. 5, two types of possible ring shapes of the first portion 401 are illustrated out. However, this is not intended to be limiting. In other embodiments, the first portion 401 can have any other types of closed ring shape having a substantially uniform/constant curvature and made of alternately connected concave arched portions and convex arched portions, such as elliptic ring shape with waved contour lines, round polygonal ring shape with waved contour lines etc. Therefore, the term "ring shape" in the present disclosure is only descriptive but not exclusive, and is intended to include any closed ring shape having a substantially uniform/constant curvature.

In accordance with an embodiment of the present invention, turning back to FIG. 2, the semiconductor device 100 may further comprise an interlayer dielectric ("ILD") layer 111 that is disposed between the metal layer (e.g. including the source metal 108 and gate metal 107) and the ESD protection structure 102 and the substrate 103 to prevent the source metal 108 being undesirably shorted to the gate region 105 and/or the gate metal 107 being undesirably shorted to the source region 106. In accordance with an embodiment of the present invention, the gate region 105 is electrically coupled to the gate metal 107 (e.g. to the gate metal runner $107_2$) through a first plurality of interlayer vias $112_1$ formed in the ILD layer 111. In the example of FIG. 2, the first plurality of interlayer vias $112_1$ is disposed over the trenched gate contact 205 and connecting the contact conduction layer $205_1$ to the overlying gate metal runner $107_2$. The source region 106 is electrically coupled to the overlying source metal 108 through a second plurality of interlayer vias $112_2$ formed in the ILD layer 111. The ESD protection structure 102 is electrically coupled to the overlying source metal 108 and the overlying gate metal pad $107_1$ respectively through a third plurality of interlayer vias $112_3$ and a fourth plurality of interlayer vias $112_4$ formed in the ILD layer 111. In an embodiment, the first portion 401 of the ESD protection layer 110 in the ESD protection structure 102 is substantially formed surrounding the gate metal pad $107_1$. The first portion 401 has a portion under a portion of the gate metal pad $107_1$ to form a first overlapped area between the ESD protection structure 102 and the gate metal pad $107_1$, and another portion laterally extended under a portion of the source metal 108 to form a second overlapped area between the ESD protection structure 102 and the source metal 108. In this circumstance, the outermost first-conductivity-type doped zone $110_1$ among the plurality of first-conductivity type doped zones $110_1$ and second-conductivity-type doped zones $110_2$ is connected to the source metal 108 through the third plurality of interlayer vias $112_3$ disposed in portions of the ILD layer 111 located in the second overlapped area, and the innermost first-conductivity-type doped zone $110_1$ is connected to the gate metal pad $107_1$ through the fourth plurality of inter layer vias $112_4$ disposed in portions of the ILD layer 111 located in the first overlapped area. In this fashion, the ESD protection structure 102 is electrically coupled between the gate electrode/metal 107 and the source electrode/metal 108 of the semiconductor device 100 to provide ESD protection. One having ordinary skill in the art should understand that the term "plurality of" herein is not exclusively limited to more than one, but is intended to include one.

Figure 6:
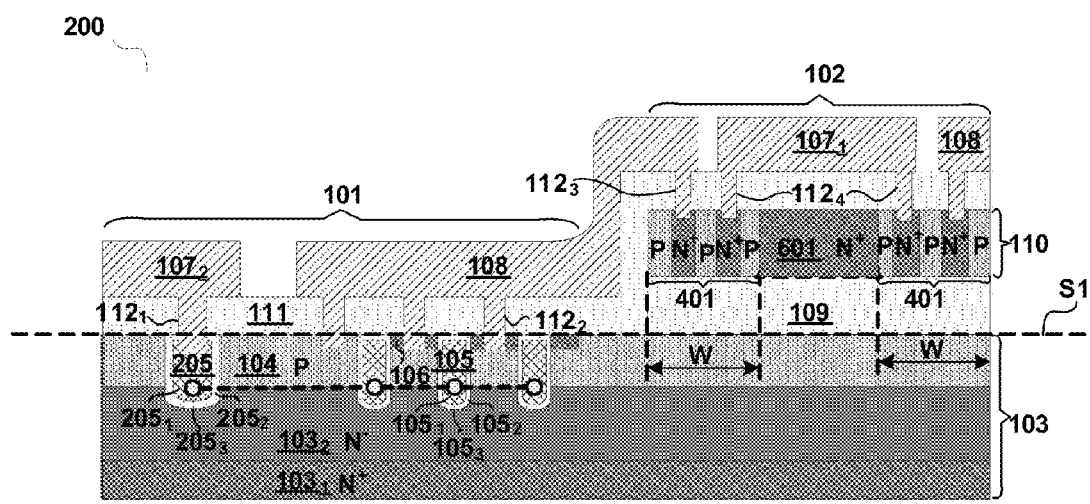
FIG. 6 illustrates a cross-sectional view of a semiconductor device 200 in accordance with an exemplary embodiment of the present invention.
Figure 7:
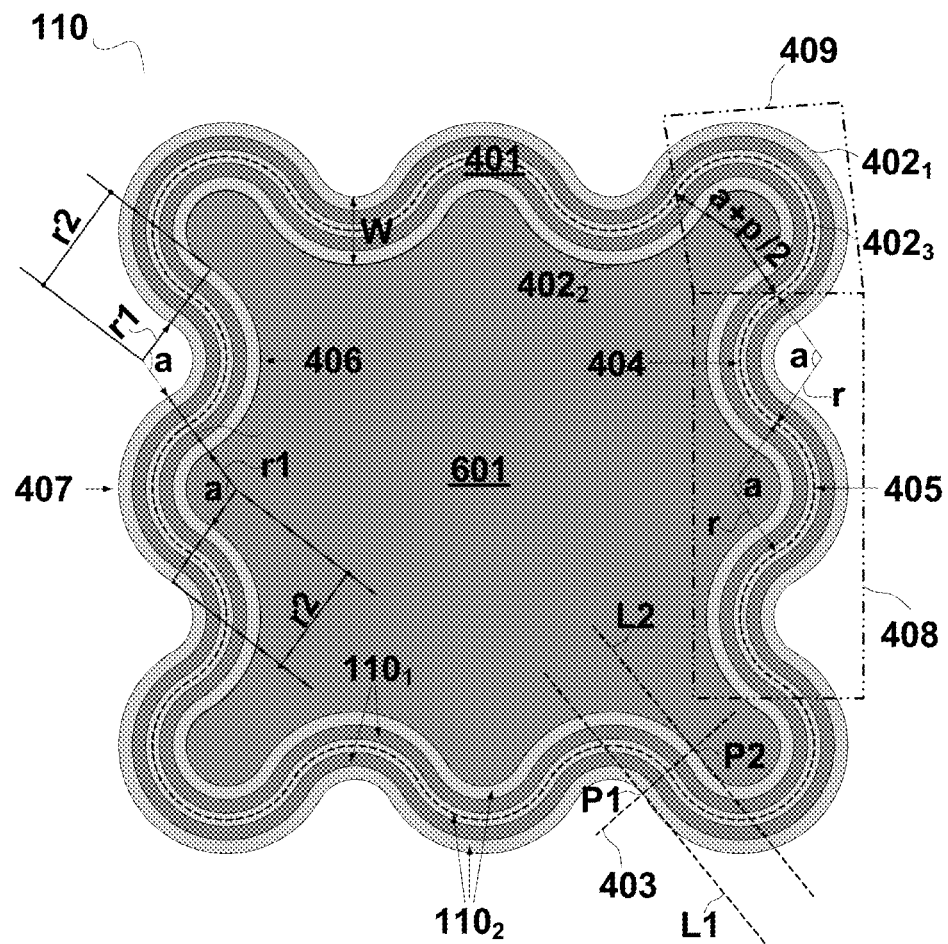
FIG. 7 illustrates an enlarged top plan view of the ESD protection layer 110 in the semiconductor device 200 in accordance with an exemplary embodiment of the present invention.

FIG. 6 illustrates a cross-sectional view of a semiconductor device 200 in accordance with an exemplary embodiment of the present invention. FIG. 7 illustrates an enlarged top plan view of the ESD protection layer 110 in the semiconductor device 200 in accordance with an exemplary embodiment of the present invention. Components or structures in the semiconductor device 200 with substantially the same functions as those of the semiconductor device 100 are identified by the same reference labels for the sake of simplicity. Referring to FIGS. 6 and 7, the ESD protection layer 110 of the ESD protection structure 102 in the semiconductor device 200 may comprise the first portion 401 of a substantially closed ring shape with waved contour lines and having a substantially uniform/constant curvature. The ESD protection layer 110 in the semiconductor device 200 may further comprise a second portion 601 of a closed solid shape, wherein the closed solid shaped second portion 601 has a contour line matched with the inner contour line $402_2$ of the first portion 401. That is to say, the closed solid shaped second portion 601 fills the vacancy in FIG. 4 defined by the inner contour line $402_2$ of the first portion 401. The second portion 601 may be doped to have a conductivity type opposite to the conductivity type of the innermost doped zone among the plurality of first-conductivity-type doped zones $110_1$ and second-conductivity-type doped zones $110_2$ in the first portion 401. For instance, the innermost doped zone in the first portion 401 illustrated in FIG. 6 and FIG. 6 is a second-conductivity-type doped zone $110_2$ (e.g. a P type doped zone), then the entire second portion 601 is doped to have the first-conductivity-type (e.g. an $N^+$ type doped portion) that is opposite to the second-conductivity-type.

In accordance with an embodiment of the present invention, still referring to FIG. 6, the first portion 401 is disposed substantially under a portion of the gate metal pad $107_1$ and is laterally extended under an adjacent portion of the source metal 108, wherein the adjacent portion of the source metal 108 is substantially surrounding the gate metal pad $107_1$. The second portion 601 is disposed under a remained substantial portion of the gate metal pad $107_1$. In the embodiment of FIGS. 6 and 7, the outer most first-conductivity-type doped zone $110_1$ of the first portion 401 is connected to the source metal 108 through the third plurality of interlayer vias $112_3$, and the second portion 601 is connected to the gate metal pad $107_1$ through the fourth plurality of interlayer vias $112_4$. Since the second portion 601 and the gate metal pad $107_1$ have an overlapped area that is made as large as possible, which renders a larger contactable area (i.e. the allowable area for forming connections, e.g. the interlayer vias $112_4$) between the second portion 601 and the gate metal pad $107_1$, a contact resistance between the gate metal 107 and the ESD protection structure 102 may be beneficially reduced.

In accordance with various embodiments of the present invention described with reference to FIGS. 2-7, although the structures of a semiconductor device having an ESD protection structure are illustrated and explained by providing the examples of N-channel vertical semiconductor devices 100 and 200 comprising the N-channel vertical MOSFET 101 and the ESD protection structure 102, this is not intended to be limiting. Persons of ordinary skill in the art will understand that the structures and principles taught herein also apply to other types of semiconductor materials and devices as well, for example, the device 100 may be a P-channel semiconductor device. In other alternative embodiments, the semiconductor transistor 101 may be a DMOS transistor, BJT etc. The semiconductor transistor 101 is not limited to vertical transistor and trenched gate transistor described, but can be a lateral transistor or a planar gate transistor instead.

The advantages of the various embodiments of the ESD protection structures 102 and the semiconductor devices 100 and 200 comprising the same of the present invention are not confined to those described above. These and other advantages of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

We claim:

1. An ESD protection structure comprising:
a patterned conductive ESD protection layer including a first portion of a substantially closed ring shape, wherein the ring shaped first portion has an outer contour line and an inner contour line parallel with each other, and wherein the outer contour line and the inner contour line are waved lines; and wherein
the first portion further has a midline located between the outer contour line and the inner contour line, wherein the midline is a waved line and is substantially parallel with both the outer contour line and the inner contour line, and wherein the midline has a first distance to the outer contour line and a second distance to the inner contour line, and wherein the first distance and the second distance are substantially equal, and wherein the midline has a substantially constant curvature at each point of the midline; and wherein
the first portion is doped to include a plurality of first-conductivity-type doped zones and second-conductivity-type doped zones arranged alternately between the outer contour line and the inner contour line in a direction along a normal line of the midline at each point of the midline, wherein the first-conductivity-type is opposite to the second-conductivity-type, and wherein the contour lines of each of the first-conductivity-type doped zones and second-conductivity-type doped zones are substantially parallel with the outer contour line and the inner contour line of the first portion.

2. The ESD protection structure of claim 1, wherein the midline of the first portion comprises a plurality of alternately connected concave arcs and convex arcs, wherein each concave arc is arched to the inner side of the ring shaped first portion, and wherein each convex arc is arched to the outer side of the ring shaped first portion, and wherein the concave arcs and the convex arcs have a substantially same radius.

3. The ESD protection structure of claim 1, wherein the first portion comprises a plurality of alternately connected concave arched portions and convex arched portions that make the closed ring shape, wherein each concave arched portion is arched to the inner side of the ring shaped first portion, and each convex arched portion is arched to the outer side of the ring shaped first portion, and wherein each of the concave arched portions and the convex arched portions has a substantially same inside radius and a substantially same outside radius.

4. The ESD protection structure of claim 1, wherein the plurality of first-conductivity-type doped zones and second-conductivity-type doped zones comprise a second-conductivity-type middle doped zone, and a plurality of first-conductivity-type doped zones and second-conductivity-type doped zones arranged alternately from both sides of the middle doped zone towards both the outer contour line and the inner contour line of the first portion, and wherein the middle doped zone is formed along the midline of the first portion.

5. The ESD protection structure of claim 1, wherein the closed ring shape is substantially a rectangle ring shape, and wherein the midline of the rectangle ring shaped first portion consists of a plurality of alternately connected concave arcs and convex arcs, and wherein the concave arcs and the convex arcs at each side of the midline have a substantially equal radian, and wherein the arcs of the midline at each corner of the rectangle ring shape have a radian of π/2 larger than that of the arcs at each side of the midline.

6. The ESD protection structure of claim 1, wherein the closed ring shape is substantially a circular ring shape, and wherein the midline of the circular ring shaped first portion consists of a plurality of alternately connected concave arcs and convex arcs, and wherein the concave arcs have a substantially equal radian, and the convex arcs have a substantially equal radian, and wherein the radian of each of the concave arcs has a designed radian difference from the radian of each of the convex arcs.

7. The ESD protection structure of claim 1, wherein the patterned conductive ESD protection layer further includes:
 a second portion of a closed solid shape, wherein the closed solid shaped second portion has a contour line matched with the inner contour line of the first portion; and wherein
 the second portion is doped to have a conductivity type opposite to the conductivity type of the innermost doped zone among the plurality of first-conductivity-type doped zones and second-conductivity-type doped zones in the first portion.

8. A semiconductor device comprising:
 a semiconductor substrate of a first conductivity type;
 a semiconductor transistor, formed in the semiconductor substrate and having a drain region, a gate region, and a source region; and
 an ESD protection structure, formed atop a top surface of the semiconductor substrate, wherein the ESD protection structure comprises an ESD isolation layer and a patterned conductive ESD protection layer, and wherein the ESD isolation layer is disposed between the ESD protection layer and the substrate to isolate the ESD protection layer from the substrate; and wherein
 the ESD protection layer comprises a first portion of a substantially closed ring shape, wherein the ring shaped first portion has an outer contour line and an inner contour line parallel with each other, and wherein the outer contour line and the inner contour line are waved lines; and wherein
 the first portion further has a midline located between the outer contour line and the inner contour line, wherein the midline is a waved line and is substantially parallel with both the outer contour line and the inner contour line, and wherein the midline has a first distance to the outer contour line and a second distance to the inner contour line, and wherein the first distance and the second distance are substantially equal, and wherein the midline has a substantially constant curvature at each point of the midline; and wherein
 the first portion is doped to include a plurality of first-conductivity-type doped zones and second-conductivity-type doped zones arranged alternately between the outer contour line and the inner contour line in a direction along a normal line of the midline at each point of the midline, wherein the first-conductivity-type is opposite to the second-conductivity-type, and wherein the contour lines of each of the first-conductivity-type doped zones and second-conductivity-type doped zones are substantially parallel with the outer contour line and the inner contour line of the first portion.

9. The semiconductor device of claim 8, wherein the ESD protection structure is electrically coupled between the gate region and the source region of the semiconductor transistor.

10. The semiconductor device of claim 8, further comprising:
 an interlayer dielectric layer formed atop the ESD protection structure and the substrate;
 a gate metal formed atop the interlayer dielectric layer and electrically coupled to the gate region through a first plurality of interlayer vias in the interlayer dielectric layer; and
 a source metal formed atop the interlayer dielectric layer and separated from the gate metal with a gap, wherein the source metal is electrically coupled to the source region through a second plurality of interlayer vias in the interlayer dielectric layer; and wherein
 the ESD protection structure is electrically coupled to the source metal through a third plurality of interlayer vias in the interlayer dielectric layer, and is further electrically coupled to the gate metal through a fourth plurality of interlayer vias in the interlayer dielectric layer.

11. The semiconductor device of claim 10, wherein:
 the gate metal includes a gate metal pad and a gate metal runner; and wherein
 the first portion of the ESD protection layer is substantially formed surrounding the gate metal pad; and wherein
 the outermost first-conductivity-type doped zone among the plurality of first-conductivity type doped zones and second-conductivity-type doped zones is connected to the source metal through the third plurality of interlayer vias, and the innermost first-conductivity-type doped zone is connected to the gate metal pad through the fourth plurality of interlayer vias.

12. The semiconductor device of claim 8, wherein the patterned conductive ESD protection layer further includes:
 a second portion of a closed solid shape, wherein the closed solid shaped second portion has a contour line matched with the inner contour line of the first portion; and wherein
 the second portion is doped to have a conductivity type opposite to the conductivity type of the innermost doped zone among the plurality of first-conductivity-type-doped zones and second-conductivity-type doped zones in the first portion.

13. The semiconductor device of claim 12, further comprising:
 an interlayer dielectric layer formed atop the ESD protection structure and the substrate;
 a gate metal formed atop the interlayer dielectric layer and having a gate metal pad and a gate metal runner, wherein the gate metal is electrically coupled to the gate region through a first plurality of interlayer vias in the interlayer dielectric layer; and
 a source metal formed atop the interlayer dielectric layer and separated from the gate metal with a gap, wherein the source metal is electrically coupled to the source region through a second plurality of interlayer vias in the interlayer dielectric layer; and wherein
 the first portion of the ESD protection layer is substantially formed surrounding the gate metal pad; and wherein
 the second portion is substantially formed under a substantial portion of the gate metal pad; and wherein
 the outermost first-conductivity-type doped zone among the plurality of first-conductivity type doped zones and second-conductivity-type doped zones in the first portion is connected to the source metal through a third plurality of interlayer vias in the interlayer dielectric layer, and the second portion is connected to the gate metal pad through a fourth plurality of interlayer vias in the interlayer dielectric layer.

* * * * *